INVENTOR:
MASAAKI SAKUTA
TOSHIMASA ISHIDA

BY Chittick, Pfund, Birch, Samuels & Gauthier ATTORNEY

INVENTOR:

MASAAKI SAKUTA
TOSHIMASA ISHIDA

BY Chittick, Pfund, Birch, Samuels & Gauthier
ATTORNEYS

United States Patent Office 3,752,713

Patented Aug. 14, 1973

3,752,713

METHOD OF MANUFACTURING SEMICONDUCTOR ELEMENTS BY LIQUID PHASE EPITAXIAL GROWING METHOD

Masaaki Sakuta and Toshimasa Ishida, Tokyo, Japan, assignors to Oki Electric Industry Co., Ltd., Tokyo, Japan Filed Feb. 10, 1971, Ser. No. 114,174
Claims priority, application Japan, Feb. 14, 1970, 45/12,276, 45/12,277
Int. Cl. H01l 7/38
U.S. Cl. 148—171 9 Claims

ABSTRACT OF THE DISCLOSURE

A semiconductor element of multi-layer construction with P-N junctions between layers is prepared by contacting a semiconductor substrate with a solution containing at least three elements of groups III and V and doped with a P-type impurity and a N-type impurity, contacting a semiconductor substrate with the solution, heating the semiconductor substrate and the solution to a predetermined temperature and repeating alternately a relatively slow cooling and a relatively fast cooling to grow layers of semiconductor crystals of the III–V compounds.

BACKGROUND OF THE INVENTION

This invention relates to a method of manufacturing semiconductor elements by the liquid phase epitaxial growing method, and more particularly to a method of manufacturing crystals of semiconductors of III–V compounds having a plurality of layers by utilizing a single process step or a single solution.

As is well known in the art, semiconductor elements of the multi-layer construction can be made to have a negative resistance characteristic known as the thyratron characteristic or the switching diode characteristic as in the three terminal transistors or the bidirectional controlled rectifier elements. Where at least one PN junction of such a multi-layer semiconductor element is formed by doping a suitable impurity in a semiconductor body of a III–V compound such as GaAlAs or GaAlP the semiconductor body emanates light rays in the visible range. By utilizing this luminous characteristic together with above described thyratron characteristic it is possible to use the semiconductor element as a photoswitching element in various fields for performing such operations as display, memory, control and computations.

To grow highly crystalline crystals of semiconductors of III–V compounds, an epitaxial method of growing using vapor phase or liquid phase has been used.

While the method of liquid phase epitaxial growing is more advantageous than the method of gaseous phase epitaxial growing in that the apparatus is more simple and inexpensive and that the crystals grow at a relatively low temperature and in a relatively short time, the number of layers that can be grown by one operation is generally limited to one so that it is difficult to vary the conductivity type as desired.

For this reason, it is necessary to repeat several operations to obtain a multi-layer crystal by the liquid phase epitaxial growing method thus not only complicating the process steps but also resulting in the contamination and modification of the crystal.

SUMMARY OF THE INVENTION

It is therefore the principal object of this invention to provide a novel method of manufacturing a semiconductor element capable of growing crystals of III–V compounds having multi-layer construction by a single liquid phase epitaxial growing operation.

Another object of this invention is to provide a novel method of liquid phase epitaxial growing for obtaining a semiconductor element acting as a photoswitching element emanating visible light rays having any desired peak wavelength.

According to this invention, use is made of a solution containing at least three elements of groups III and V such as Ga-Al-As or Ga-Al-P and doped with a P-type impurity and a N-type impurity in a suitable proportion, both in the weight ratio and as the absolute quantities, and a slow cooling step and a fast cooling step are repeated alternately while a semiconductor substrate is maintained in contact with the solution, the slow cooling step forming a P-type semiconductor layer of the III–V compound and the fast cooling step forming a N-type semiconductor layer of the III–V compound, thus forming P-N junctions between layers capable of emanating visible light.

Further, according to this invention, during the last slow cooling step, the impurity having higher vapor pressure is evaporated off whereby the impurity having lower vapor pressure now becomes the relatively significant impurity and participates in the growth of the semiconductor layer to form a PN junction capable of emanating visible light rays.

BRIEF DESCRIPTION OF THE DRAWINGS

Further objects and advantages of the invention will become apparent from the following description when taken in conjunction with the accompanying drawings in which.

DESCRIPTION OF THE PREFERRED EMBODIMENTS

Figure 1:
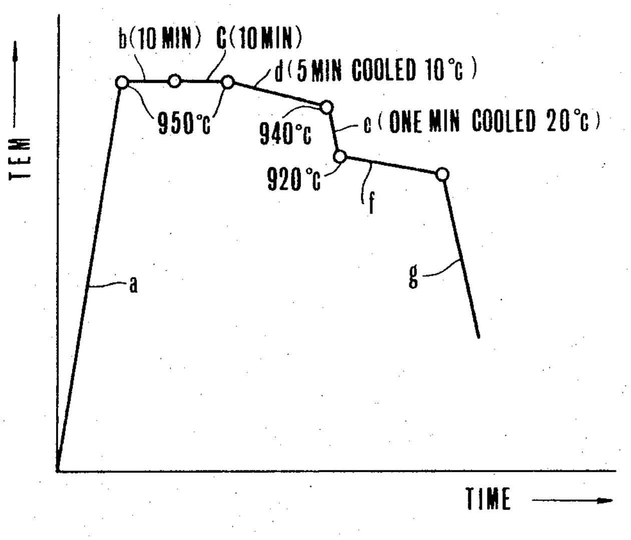
FIG. 1 is a plot to show a temperature program utilized in the method of liquid phase epitaxial growing embodying the present invention.

With reference now to the temperature program shown in FIG. 1, a preferred embodiment of the invention will be described wherein a substrate comprises a single crystal of GaAs, a solution of three elements of groups III–V, e.g. Ga-Al-As is used, tellurium is used as a N-type impurity and zinc is used as a P-type impurity.

The substrate and solution are contained in a high purity graphite boat and the boat is placed in an opened tube of quartz. While passing a high purity reducing gas or a high purity inert gas for preventing oxidation through the tube, the solution and the substrate are heated to 950° C. (step *a*), are maintained at this temperature for 10 minutes (step *b*) so as to contact the substrate with the solution and are then maintained at this temperature for an additional 10 minutes (step *c*).

The composition of the solution or the liquid raw material in contact with the substrate during these process steps is illustrated in the following table wherein the weight ratio of zinc acting as the P-type impurity to tellurium acting as the N-type impurity being 2:1. Ratios above or below this ratio do not cause the PN inversion described later.

Table

| | | |
|---|---|---|
| Ga | g | 4 |
| GaAs | mg | 1300 |
| Al | mg | 80 |
| Zn | μg | 300 |
| Te | μg | 150 |

Advantageously, a P-type GaAs mono-crystal is used as the substrate.

After the step C, the substrate and the solution are cooled for 5 minutes (step D) at a slow cooling speed of 2° C./min. During this slow cooling step D a GaAlAs layer is formed having the P-type conductivity.

The substrate formed with the GaAlAs layer and the solution are then cooled for 1 minute at a faster cooling speed of 20° C./min. for example (step *e*). During this step, a GaAs layer or a GaAlAs layer containing a small proportion of Al grows having N-type conductivity. For the sake of illustration, in the following description, it is assumed that a GaAlAs layer grows in this step *e*. Thereafter, a slow cooling step *f* and a fast cooling step *g* are similarly repeated to form a P-type GaAlAs layer and a N-type GaAlAs layer.

Figure 2:
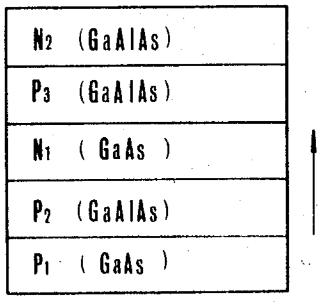
FIG. 2 is a diagram showing the manner of growing various semiconductor layers of a visible light switching element prepared by the method of this invention.

FIG. 2 shows an example of a laminated construction of a plurality of layers grown by the above steps, the direction of the growth of the crystals being shown by an arrow. In FIG. 2, $P_1$ designates the GaAs substrate, $P_2$ and P-type GaAlAs layer, $N_1$ the N-type GaAs layer, $P_3$ the P-type GaAlAs layer, and $N_2$ the N-type GaAlAs layer. With a photoswitching element having the construction just described, under the forward or on state, the luminescence occurs at the PN junctions between layers $P_2$ and $N_1$ and between layers $P_3$ and $N_2$. Since these junctions are formed in the GaAlAs layers and since it is possible to control the concentration of aluminum at these junctions by varying the weight of aluminum contained in the solution and the weight of zinc and tellurium and by varying the temperature control, it is possible to manufacture a photoswitching element emanating visible light rays of any desired peak wavelength.

Figure 3:
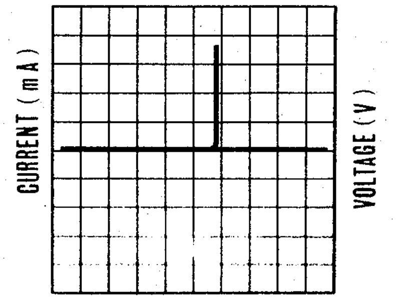
FIG. 3 shows a voltage-current characteristic curve of a visible light switching element manufactured by the method of this invention.

FIG. 3 shows the voltage-current characteristic or the thyratron characteristic of a GaAlAs photoswitching element fabricated in this manner wherein the abscissa is graduated with volts (at a spacing of 2 volts) and the ordinate with current (at a spacing of 10 ma.). The negative resistance is shown as a horizontal line.

According to this embodiment, a semiconductor element of PNPN . . . multi-layer construction can be grown by a single procedure by the method of liquid phase epitaxial growing of GaAlAs by utilizing zinc and tellurium as the impurities which emanate light wavelengths most sensible to human eyesight. This is to be compared with the known method of growing according to which the multi-layer construction of GaAlAs can be formed only by two or more growing steps.

It is also possible to use a Ga-Al-P solution instead of the Ga-Al-As solution and a GaP substrate may be substituted for the GaAs substrate. Further, in addition to zinc, cadmium and the like may also be used as the P-type impurity.

Further, it should be understood that the respective cooling speeds are not limited to the values given above. For example, with a solution containing tellurium at a weight ratio, based on the total quantity of the solution, of $1.5\times10^{-5}$ to $4.0\times10^{-5}$, the speed of slow cooling may range from 0° C./min. to 5° C./min., whereas the speed of fast cooling may range from 10° C./min. to 30° C./min.

Figure 4:
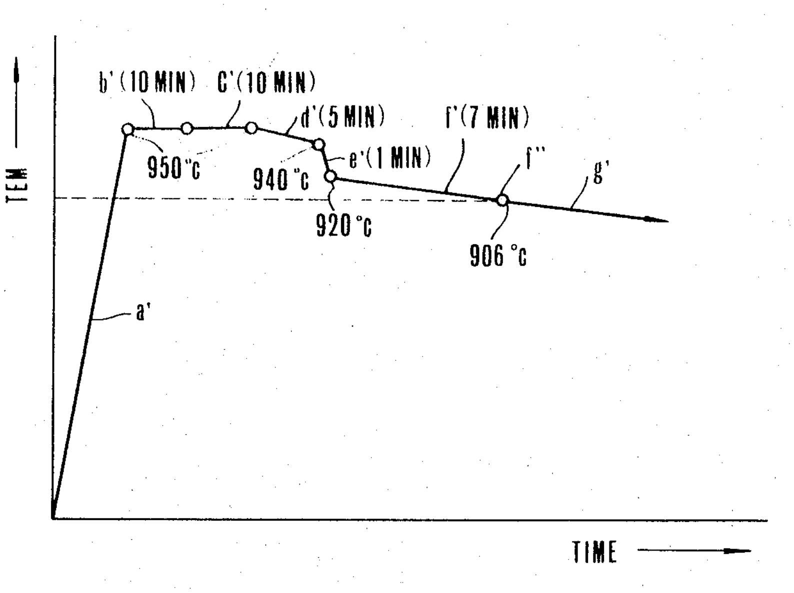
FIG. 4 is a plot showing a modified temperature program utilized in the method of liquid phase epitaxial growing according to this invention.
Figure 5:
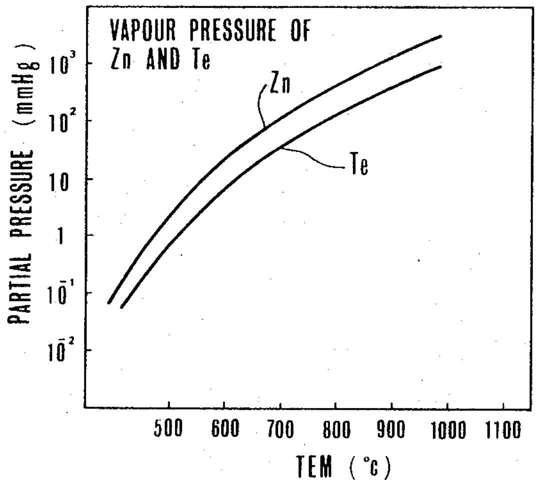
FIG. 5 shows vapor pressure-temperature curves of zinc (Zn) and tellurium (Te) used as the impurities in a modified embodiment of this invention.

A modified embodiment of this invention will be described hereunder with reference to FIGS. 4 and 5.

Again, a GaAs monocrystal is used as the substrate, the solution contains three elements of Ga-Al-As of the groups III–V, zinc is used as the P-type impurity and tellurium as the N-type impurity. The substrate and the solution are put in a high purity graphite boat contained in an open quartz tube passed with a high purity reducing gas or a high purity inert gas for the purpose of preventing oxidation. As shown in FIG. 4, the substrate and solution are heated to 950° C. by a step *a'*, maintained at this temperature for 10 minutes (step *b'*) and then the substrate is maintained in contact with the solution for 10 minutes at this temperature (step *c'*). Then the substrate and solution are slowly cooled at a speed of 2° C./min. for 5 minutes (step *d'*) to grow a P-type GaAlAs layer. After decreasing the temperature 10 degrees C. during this step, the substrate and solution are quenched for one minute at a speed of 20° C./min. (step *e'*) to grow a N-type GaAlAs layer.

Then, the substrate with the N-type GaAlAs layer is cooled slowly for 7 min. (step *f'*) for growing a P-type GaAlAs layer on the N-type layer. The steps thus far described are identical to those of the previous embodiment. However, as the vapor pressure of zinc is considerably higher than that of tellurium as shown in FIG. 5, during step *f'* the zinc in the solution evaporates off at a considerable higher rate than tellurium, thus gradually increasing the percentage of the tellurium in the solution. Accordingly, at a point *f''* after the end of step *f'* of seven minutes and at 906° C., for example, the quantity of tellurium in the solution becomes larger than that of zinc. Thereafter, the substrate is slowly cooled at the same cooling speed of 2° C./min. (step g') to form another N-type GaAlAs layer.

Alternatively, the slow cooling step and the fast cooling step may be alternately repeated followed by maintaining the solution and substrate at a constant temperature and a slow cooling step thereafter.

These modified process steps also give a photoswitching element having similar characteristics to that produced by the first embodiment.

It should be understood that the invention is not limited to any particular substrate, N-type and P-type impurities and rate of cooling illustrated hereinabove.

What is claimed is:

1. A method of manufacturing a semiconductor element by the method of liquid phase epitaxial growing comprising the steps of preparing a solution containing at least Ga and Al, and P or As and doped with a P-type impurity and a N-type impurity, heating a semiconductor substrate and the solution to be predetermined temperature, contacting the semiconductor substrate with said solution, and repeating alternately a relatively slow cooling step and a relatively fast cooling step so as to grow a semiconductor crystal having a multi-layer construction with P-N junctions between adjacent layers.

2. The method of manufacturing a semiconductor element according to claim 1 wherein said substrate is a member selected from GaAs and GaP.

3. The method according to claim 1 wherein said N-type impurity is comprised by Te and said P-type impurity is comprised by a member selected from the group consisting of Zn and Cd.

4. The method according to claim 1 wherein said slow cooling step is performed at a speed ranging from 0° C./min. to 5° C./min. and wherein said fast cooling step is performed at a speed ranging from 10° C./min. to 30° C./min.

5. A method of preparing a luminous diode of negative characteristic comprising the steps of preparing a solution containing Ga, Al and As and doped with a P-type impurity and a N-type impurity, heating a semiconductor substrate and said solution to a predetermined temperature, contacting the semiconductor substrate with said solution, and repeating alternately a relatively slow cooling step and a relatively fast cooling step for growing a semiconductor crystal having a PNPN four layer construction.

6. A method of manufacturing a semiconductor element by the liquid phase epitaxial growing method comprising the steps of preparing a solution containing Ga and Al, and P or As and doped with a N-type impurity and a P-type impurity, said N-type and P-type impurities having different vapor pressures, heating a semiconductor substrate and said solution to a predetermined temperature, contacting the semiconductor substrate with said solution, repeating alternately a relatively slow cooling step and a relatively fast cooling step thereby evaporating off said impurity having higher vapor pressure from said solution so as to reverse the relative concentration of said P-type and N-type impurities in said solution during the final slow cooling step, and further cooling slowly said substrate and said solution whereby to grow a semiconductor crystal having a multi-layer construction.

7. The method according to claim 6 wherein said P-type impurity comprises Zn and said N-type impurity comprises Te.

8. The method according to claim 6 wherein said slow cooling step is performed twice and said fast cooling step is performed once so as to grow a semiconductor crystal having a PNPN four layer construction.

9. A method of manufacturing a semiconductor element by liquid phase epitaxial growing method comprising the steps of preparing a solution containing Ga and Al, and P or As and doped with a P-type impurity and a N-type impurity, said P-type and N-type impurities having different vapor pressures, heating a semiconductor substrate and said solution to a predetermined temperature, contacting the semiconductor substrate with said solution, repeating alternately a relatively slow cooling step and a relatively fast cooling step, thereafter maintaining said substrate and said solution at a constant temperature to evaporate off said impurity having higher vapor pressure from said solution so as to invert the relative concentration of said N-type impurity and said P-type impurity in said solution, and further cooling slowly said substrate and said solution whereby to grow a semiconductor crystal having a multi-layer construction.

References Cited

UNITED STATES PATENTS 3,278,342 10/1966 John et al. .......... 148—1.6

FOREIGN PATENTS 1,149,109 4/1969 Great Britain ........ 148—171

GEORGE T. OZAKI, Primary Examiner

U.S. Cl. X.R.

148—1.5, 172, 173; 252—62.3 GA; 23—301 SP